(12) United States Patent
Hayatsu

(10) Patent No.: US 6,510,744 B1
(45) Date of Patent: Jan. 28, 2003

(54) MODELING AND ANALYSIS OF AN OBJECT COMPRISED OF MORE THAN ONE COMPONENT

(75) Inventor: Hideki Hayatsu, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/564,694

(22) Filed: May 4, 2000

(30) Foreign Application Priority Data

Sep. 3, 1999 (JP) .......................................... 11-250797

(51) Int. Cl.[7] ............................................... G01F 9/455
(52) U.S. Cl. .................................................... 73/804
(58) Field of Search ............................. 73/866.4, 865.9, 73/804; 702/41–43

(56) References Cited

U.S. PATENT DOCUMENTS 5,956,500 A * 9/1999 Shimmell
6,266,062 B1 * 7/2001 Rivara

FOREIGN PATENT DOCUMENTS

JP         8-338795         12/1996

* cited by examiner

Primary Examiner—Robert Raevis
(74) Attorney, Agent, or Firm—Staas & Halsey LLP

(57) ABSTRACT

A method of analyzing mechanical actions on an object comprised of a plurality of components includes the steps of creating a model having a general exterior shape of the object without regard to structural details of the components, obtaining separate elasticity coefficients of the model in respectively different spatial directions based on rigidities of the object, and analyzing mechanical actions on the object based on the model and the elasticity coefficients.

6 Claims, 10 Drawing Sheets

F I G. 9

WINDOW FOR ENTERING MATERIAL CHARACTERISTICS

MATERIAL :
NAME

DENSITY :

LONGITUDINAL
ELASTICITY MODULUS :

POISSON RATIO :

O K        CANCEL

MODELING AND ANALYSIS OF AN OBJECT COMPRISED OF MORE THAN ONE COMPONENT

BACKGROUND OF THE INVENTION

1. Field of the Invention

The present invention generally relates to a method of, a device for, and a record medium having a program embodied therein for analyzing a model, and particularly relates to a method of, a device for, and a record medium having a program embodied therein for analyzing a model comprised of a plurality of components.

2. Description of the Related Art

Development in computer technology has made it possible to analyze forces applied to objects without difficulty. It is desirable to be able to carry out an analysis accurately even when the analysis is directed to an object comprised of a plurality of components.

When a model used in analysis is created to accurately reflect an actual structure of an object, analysis using this model can produce accurate results. To create a structurally accurate model, however, is not an easy task and takes a lengthy time. Depending on required accuracy and time limits, a model with a simplified shape may be used.

When a stress analysis is performed for manufacturing of a bearing unit, for example, Young's moduli are used in the analysis if they are known beforehand. If Young's moduli are not known, a bearing unit comprised of balls, rings, and a case, for example, needs to be modeled accurately to take into account structural details. Alternatively, a bearing unit is replaced by substitutes that are simpler for the purpose of analysis.

FIG. 1 is an illustrative drawing showing an example of a related art analysis method.

FIG. 1 shows an example in which springs 42 are put in place 41 of a bearing unit as simplified substitutes for the bearing unit.

If all the components such as balls of the bearing unit are to be modeled with sufficient accuracy, such a modeling process requires a lengthy time period. Further, since various parameters need to be entered with respect to all the components, it is not easy to carry out the analysis.

When all the components are accurately modeled, further, a computation time may become prohibitively lengthy. If the computer does not have a sufficient computation speed, analysis may not be possible to be actually carried out.

If a simplified model such as that using the springs as substitutes for the bearing unit, there is a problem in that deformation and stress that is experienced by the bearing unit are not calculable since the bearing unit is no longer included in the analysis.

Accordingly, there is a need for a scheme for analyzing mechanical actions based on a simple model where the scheme can provide an accurate analysis of an object comprised of a plurality of components.

SUMMARY OF THE INVENTION

It is a general object of the present invention to provide a scheme for analyzing mechanical actions that substantially obviates one or more of the problems caused by the limitations and disadvantages of the related art.

Feature s and advantages of the present invention will be set forth in the description which follows, and in part will become apparent from the description and the accompanying drawings, or may be learned by practice of the invention according to the teachings provided in the description. Objects as well as other features and advantages of the present invention will be realized and attained by a scheme for analyzing mechanical actions particularly pointed out in the specification in such full, clear, concise, and exact terms as to enable a person having ordinary skill in the art to practice the invention.

To achieve these and other advantages and in accordance with the purpose of the invention, as embodied and broadly described herein, the invention provides a method of analyzing mechanical actions on an object comprised of a plurality of components, including the steps of creating a model having a general exterior shape of the object without regard to structural details of the components, obtaining separate elasticity coefficients of the model in respectively different spatial directions based on rigidities of the object, and analyzing mechanical actions on the object based on the model and the elasticity coefficients.

In the method as described above, the object comprised of a plurality of components is represented by a model that has a general exterior shape of the object without regard to structural details of the components, so that the modeling process is easy and not time consuming. Further, the elasticity coefficients are obtained as separate and probably different coefficients with respect to different directions, thereby treating the model as having anisotropic characteristics that are close to characteristics of the object. Therefore, the method can provide an accurate analysis of mechanical actions on an object based on a simplified model.

BRIEF DESCRIPTION OF THE DRAWINGS

FIG. 9 is an illustrative drawing showing a material parameters input window according to the embodiment of the present invention;

DESCRIPTION OF THE PREFERRED EMBODIMENTS

In the following, embodiments of the present invention will be described with reference to the accompanying drawings.

Figure 1:
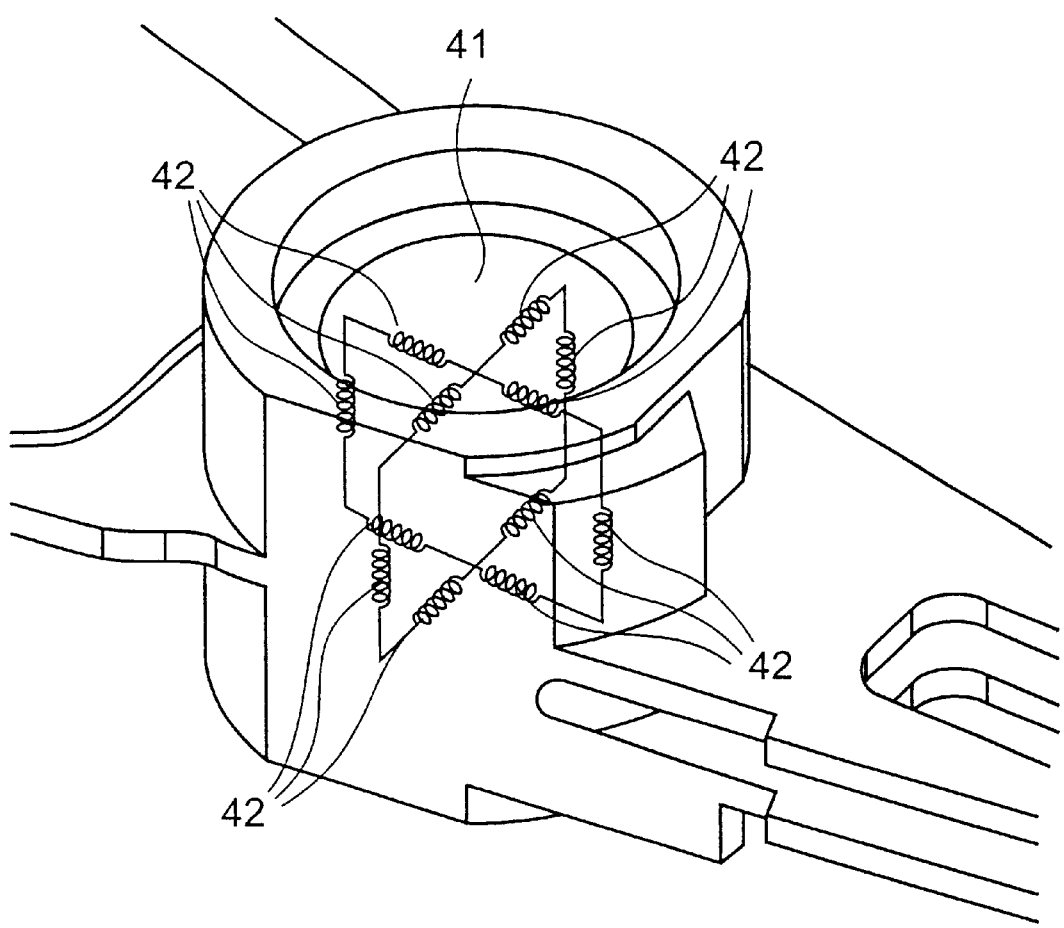
FIG. 1 is an illustrative drawing showing an example of a related art analysis method.
Figure 2:
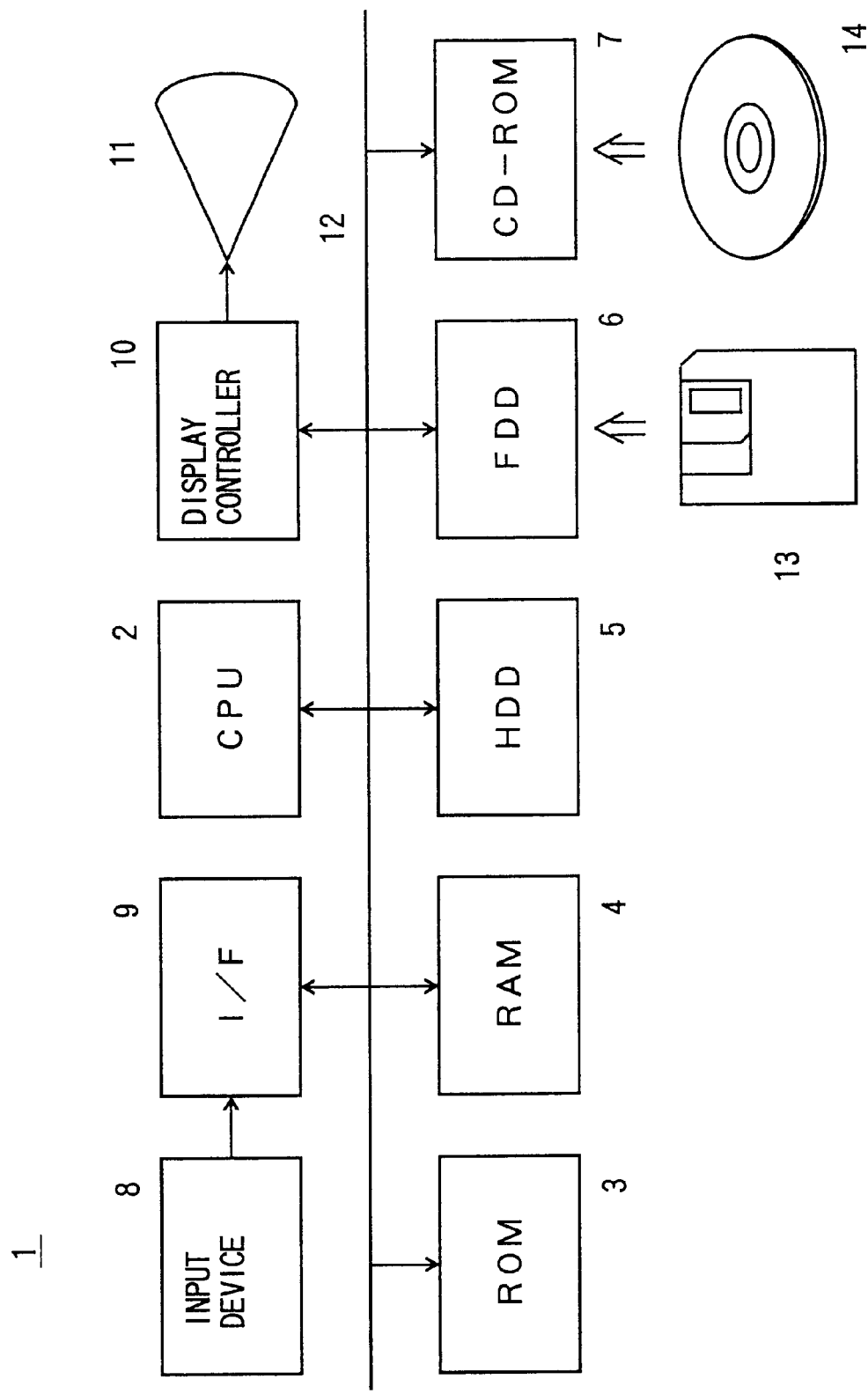
FIG. 2 is a block diagram of an analysis device according to an embodiment of the present invention.

FIG. 2 is a block diagram of an analysis device according to an embodiment of the present invention.

An analysis device 1 has a configuration typical to an ordinary computer system, and includes a CPU 2, a ROM 3, a RAM 4, a hard-drive 5, a floppy-disk drive 6, a CD-ROM drive 7, an input device 8, an interface 9, a display controller 10, a display device 11, and a bus 12.

The CPU 2 performs data processing in accordance with an analysis program which will be later described in detail. The ROM 3 stores therein boost programs such as BIOS programs. The Ram 4 has the analysis program loaded to its memory space when it is to be executed, and is also used as a work space.

The hard-drive 5 includes a record medium for recording the analysis program. The analysis program is installed to the hard-drive 5 from a floppy disk 13 via the floppy-disk drive 6 or from a CD-ROM 14 via the CD-ROM drive 7. Further, the hard-drive 5 stores processed data. The floppy-disk drive 6 has the floppy disk 13 inserted therein, and writes data in or reads data from the floppy disk 13.

The CD-ROM drive 7 has the CD-ROM 14 inserted therein, and reads data therefrom.

The input device 8 may include a keyboard and a mouse, and is used for entering data necessary for the analysis program or entering commands directed to the analysis program. Data entered through the input device 8 is supplied to the bus 12 via the interface 9.

The display controller 10 is provided between the bus 12 and the display device 11. When the analysis program is executed, the display controller 10 controls the display device 11 to prompt inputting of required data, present analysis results, etc.

In the following, a description will be given with regard to the analysis program.

Figure 3:
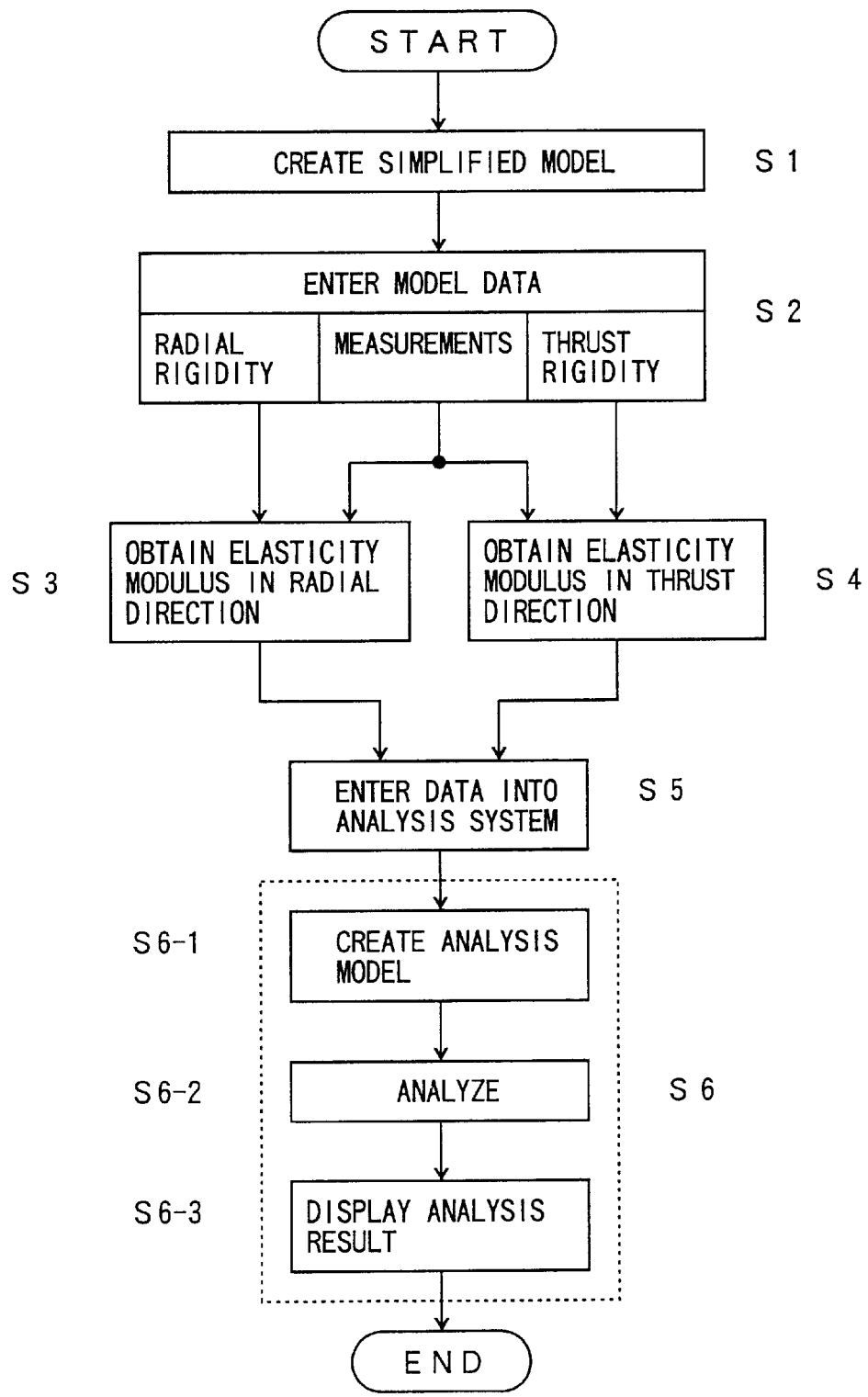
FIG. 3 is a flowchart of a process performed by an analysis program according to the embodiment of the present invention.
Figure 4:
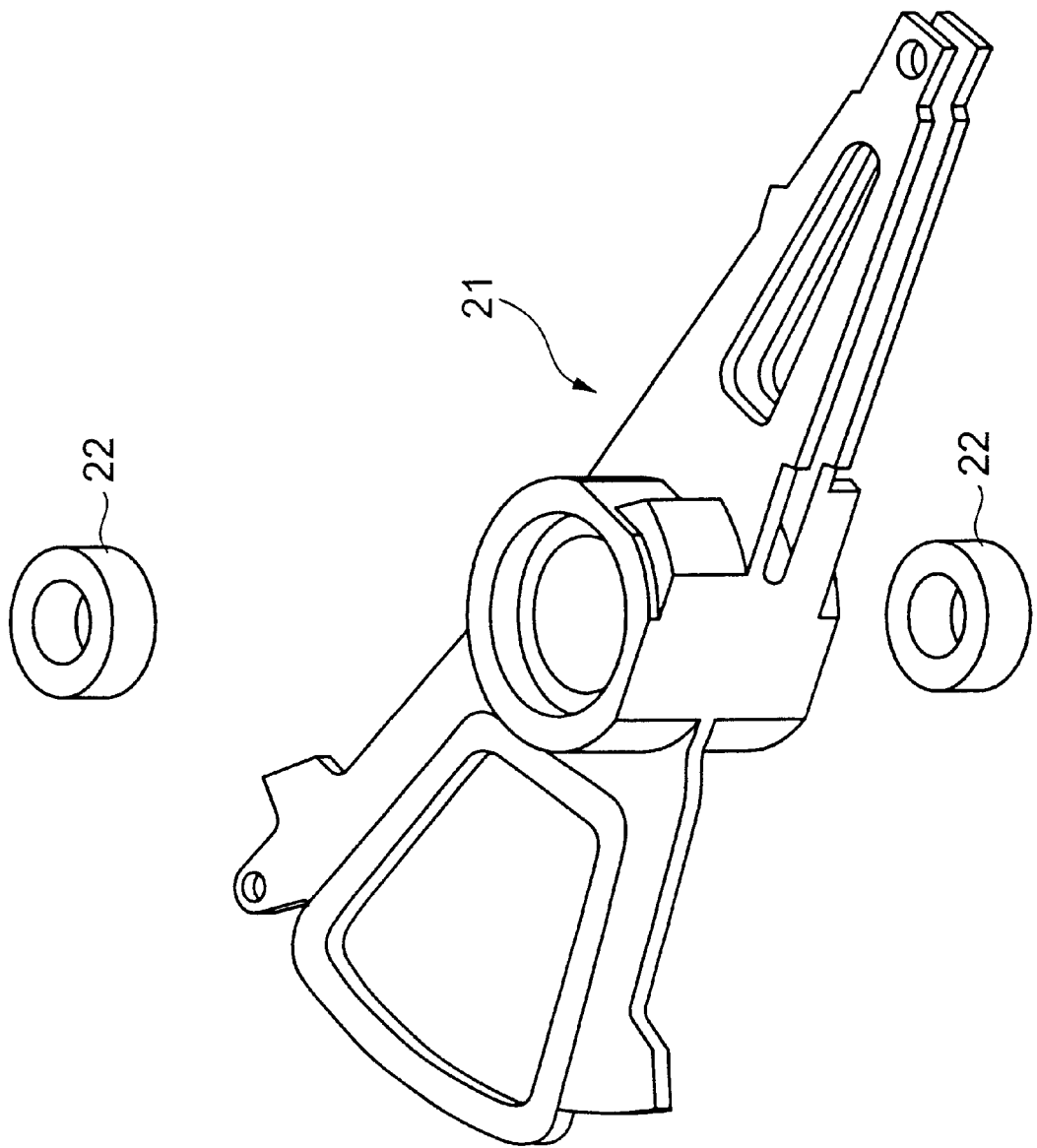
FIG. 4 is an illustrative drawing showing an analysis model used in the embodiment of the present invention.

FIG. 3 is a flowchart of the analysis program according to the embodiment of the present invention. FIG. 4 is an illustrative drawing showing an analysis model used in the embodiment of the present invention.

In this embodiment, stress analysis is conducted with respect to bearing parts 22 of a head-arm unit 21 shown in FIG. 4. The head-arm unit 21 and the bearing parts 22 are modeled separately as separate parts units. A simplified model is used for modeling each of the bearing parts 22.

At a step S1, a simplified bearing model is generated having a donut-like cylinder shape approximating the exterior shape of an actual bearing part. In reality, the bearing part includes therein bearing balls, rings, and a case, for example. The simplified bearing model of this embodiment does not simulate the inner structures of the bearing part, but simulates the exterior shape of the bearing part.

Figure 5:
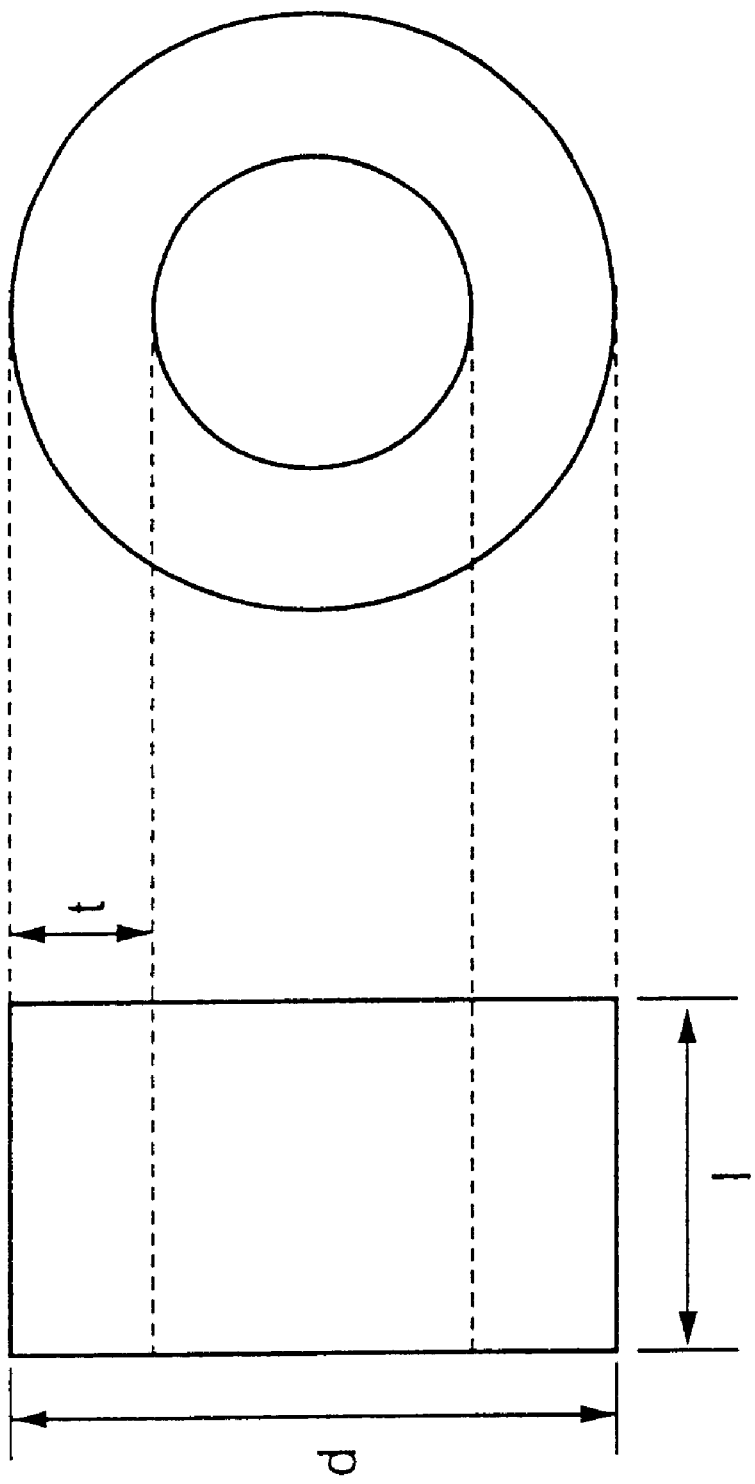
FIGS. 5A and 5B are illustrative drawings showing a simplified bearing model according to the embodiment of the present invention.

FIGS. 5A and 5B are illustrative drawings showing a simplified bearing model according to the embodiment of the present invention. FIG. 5A shows a side view of the simplified bearing model. FIG. 5B shows a front view of the simplified bearing model.

As shown in FIG. 5A, the simplified bearing model has a diameter d, a length 1, and a thickness t.

Since an object is a cylinder made of a single material and being solid without any inner structure as the donut-like cylinder of FIGS. 5A and 5B, the object should have the same elasticity modulus regardless of a direction in which the elasticity is measured. Since the model shown in FIGS. 5A and 5B simulates a bearing part, and since the bearing part has a rather complex internal structure, this model having a cylinder shape should have different elasticity moduli depending on directions.

With references to FIG. 2 again, at a step S2, data are entered with regard to measurements, a radial rigidity, and a thrust rigidity of the simplified bearing model having the cylindrical shape.

At a step S3, an elasticity modulus in a radial direction, i.e., Young's modulus, is obtained.

In what follows, a description will be given with regard to how to obtain an elasticity modulus E in a radial direction (i.e., longitudinal elasticity modulus) from the radial rigidity and the measurements of the simplified bearing model.

Figure 6:
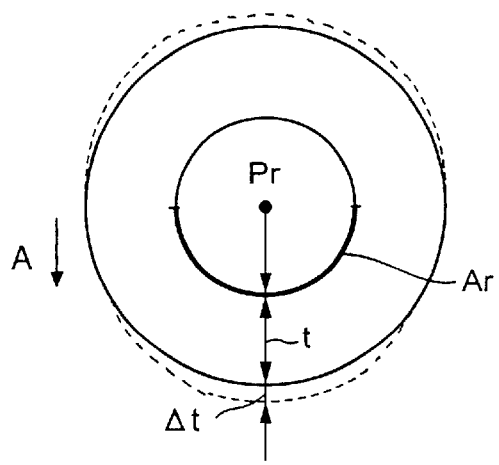
FIG. 6 is an illustrative drawing for explaining how to obtain an elasticity modulus in a radial direction with respect to the bearing unit according to the embodiment of the present invention.

FIG. 6 is an illustrative drawing for explaining how to obtain an elasticity modulus in a radial direction with respect to the bearing unit according to the embodiment of the present invention.

With a radial rigidity kr provided, a pressure Pr applied to the simplified bearing model in a radial direction as shown by an arrow A in FIG. 6 is represented as follows with reference to a shape shift Δt created by the pressure.

$$Pr = kr \cdot \Delta t \tag{1}$$

A deformation εr in the radial direction is represented as:

$$\epsilon r = \Delta t / 2t \tag{2}$$

A stress σr applied to the model is represented as:

$$\sigma r = E \cdot \epsilon r \tag{3}$$

Accordingly, the stress σr is represented as:

$$\sigma r = E \cdot \Delta t / 2t \tag{4}$$

In this case, an area Ar to which the stress σr is applied can be regarded as a half of the inner wall as shown by a solid line in FIG. 6. The area Ar is represented as in the following by using the diameter d and length 1 of the bearing.

$$Ar = (½) \cdot \pi \cdot d \cdot l \tag{5}$$

The pressure Pr is also represented as follows.

$$Pr = \sigma r \cdot Ar \tag{6}$$

By substituting the equations (4) and (5) into the equation (6), the pressure Pr is shown as:

$$Pr = E \cdot \Delta t / 2t \cdot (½) \cdot \pi d \cdot l \tag{7}$$

The pressure Pr is represented two folds as shown in the equation (1) and the equation (7). By combining the two equations, one can obtain one equation as follows.

$$kr \cdot \Delta t = E \cdot \Delta t / 2t \cdot (½) \cdot \pi \cdot d \cdot l \tag{8}$$

Accordingly, Young's modulus E is obtained as:

$$E = kr \cdot 4t / (\pi \cdot d \cdot l) \tag{9}$$

Based on the equation (9), one can calculate Young's modulus E by using the length l, diameter d, thickness t, and radial rigidity kr of the bearing.

With reference to FIG. 3 again, at a step S4, an elasticity modulus in a thrust direction is obtained from the measurements and thrust rigidity of the simplified bearing model.

In what follows, a description will be given with regard to how to obtain an elasticity modulus G in a thrust direction (i.e., traverse elasticity modulus) from the thrust rigidity and the measurements of the simplified bearing model.

Figure 7:
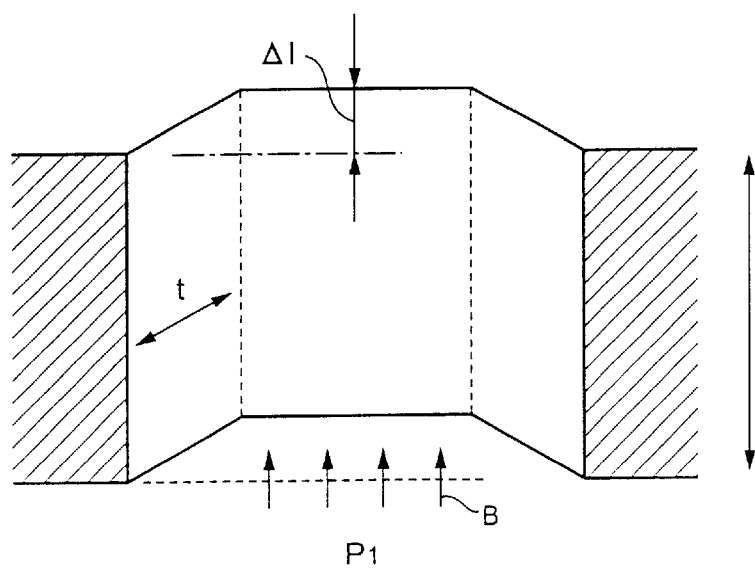
FIG. 7 is an illustrative drawing for explaining how to obtain an elasticity modulus in a thrust direction with respect to the bearing unit according to the embodiment of the present invention.

FIG. 7 is an illustrative drawing for explaining how to obtain an elasticity modulus in a thrust direction with respect to the bearing unit according to the embodiment of the present invention.

With a thrust rigidity kl provide, a pressure Pl applied to the simplified bearing model in a thrust direction as shown by arrows B in FIG. 7 is represented as follows with reference to a shape shift $\Delta l$ created by the pressure.

$$Pl = kl \cdot \Delta l \quad (10)$$

A deformation $\epsilon l$ in the thrust direction is represented as:

$$\epsilon l = \Delta l / 2l \quad (11)$$

A stress $\sigma l$ applied to the model is represented as:

$$\sigma l = G \cdot \epsilon l \quad (12)$$

Accordingly, the stress $\sigma l$ is represented as:

$$\sigma l = G \cdot \Delta l / l \quad (13)$$

In this case, an area Al to-which the stress $\sigma l$ is applied can be represented as in the following by using the diameter d and thickness t of the bearing.

$$Al = \pi \cdot d \cdot t \quad (14)$$

The pressure Pl is also represented as follows.

$$Pl = \sigma l \cdot Al \quad (15)$$

By substituting the equations (13) and (14) into the equation (15), the pressure Pl is shown as:

$$Pl = G \cdot \Delta l / l \cdot d \cdot t \quad (16)$$

The pressure Pl is represented two folds as shown in the equation (10) and the equation (16). By combining the two equations, one can obtain one equation as follows.

$$kl \cdot \Delta l = G \cdot \Delta l / l \cdot \pi \cdot d \cdot t \quad (17)$$

Accordingly, Young's modulus G is obtained as:

$$G = kl \cdot l / (\pi \cdot d \cdot t) \quad (18)$$

Based on the equation (18), one can calculate the traverse elasticity modulus G by using the length l, diameter d, thickness t, and thrust rigidity kl of the bearing.

As described above, the longitudinal elasticity modulus E is obtained from the equation (9), and the traverse elasticity modulus G is obtained from the equation (18). Namely, the longitudinal elasticity modulus E and the traverse elasticity modulus G are readily obtained by using the length l, diameter d, thickness t, radial rigidity kr, and thrust rigidity kl of the bearing.

With reference to FIG. 3 again, at a step S5, the longitudinal elasticity modulus E and the traverse elasticity modulus G are passed to the analysis system.

At a step S6, analysis is conducted by using the longitudinal elasticity modulus E and the traverse elasticity modulus G.

The analysis at the step S6 may be carried out by using a commercially available analysis system. For example, an analysis system such as ABAQUS by Hibbit, Karlsson & Sorensen, Inc. may be used at the step S6.

At a step S6-1 of the step S6, an analysis model is created.

Figure 8:
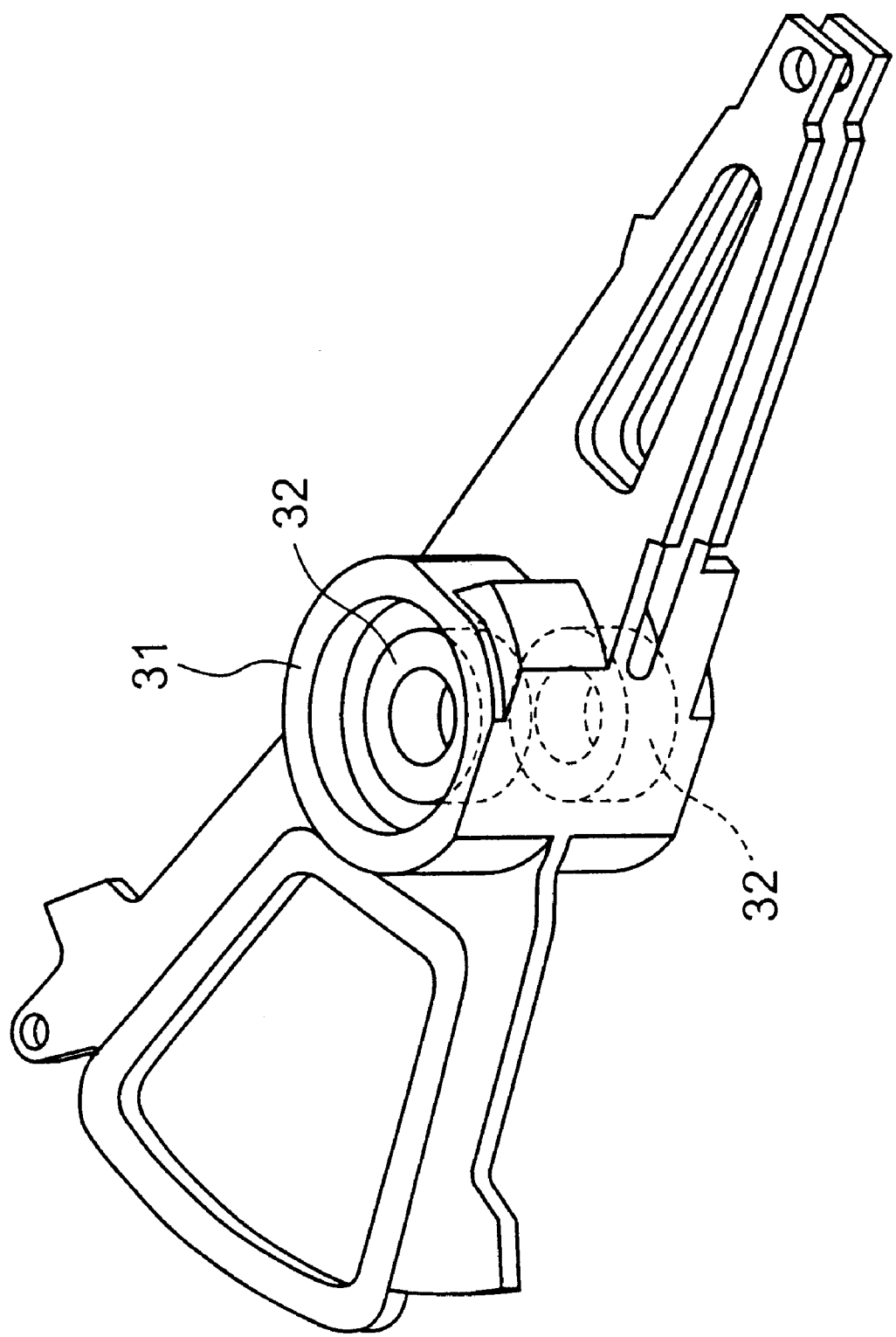
FIG. 8 is an illustrative drawing showing an analysis model used in the embodiment of the present invention.

FIG. 8 is an illustrative drawing showing an analysis model used in the embodiment of the present invention.

As shown in FIG. 8, the analysis model has a head-arm model 31 and simplified bearing models 32 connected together. In order to use ABAQUS for model analysis, elasticity coefficients need to be entered into the system.

FIG. 9 is an illustrative drawing showing a material parameters input window according to the embodiment of the present invention.

The input window of the ABAQUS shown in FIG. 9 includes a field for entering a material name, a field for entering a mass density, a field for entering a longitudinal elasticity modulus, and a field for entering a Poisson ratio. In order to use ABAQUS for stress analysis, Young's modulus, i.e., a longitudinal elasticity modulus needs to be entered in its field provided on the input window.

In the present invention, the elasticity moduli E and G are obtained through the steps S1 through S4, and are entered into the system at the step S5 by entering Young's modulus in the input field as shown in FIG. 9. Then, the analysis is conducted at a step S6-2, and analysis results are displayed at a step S6-3.

Figure 10:
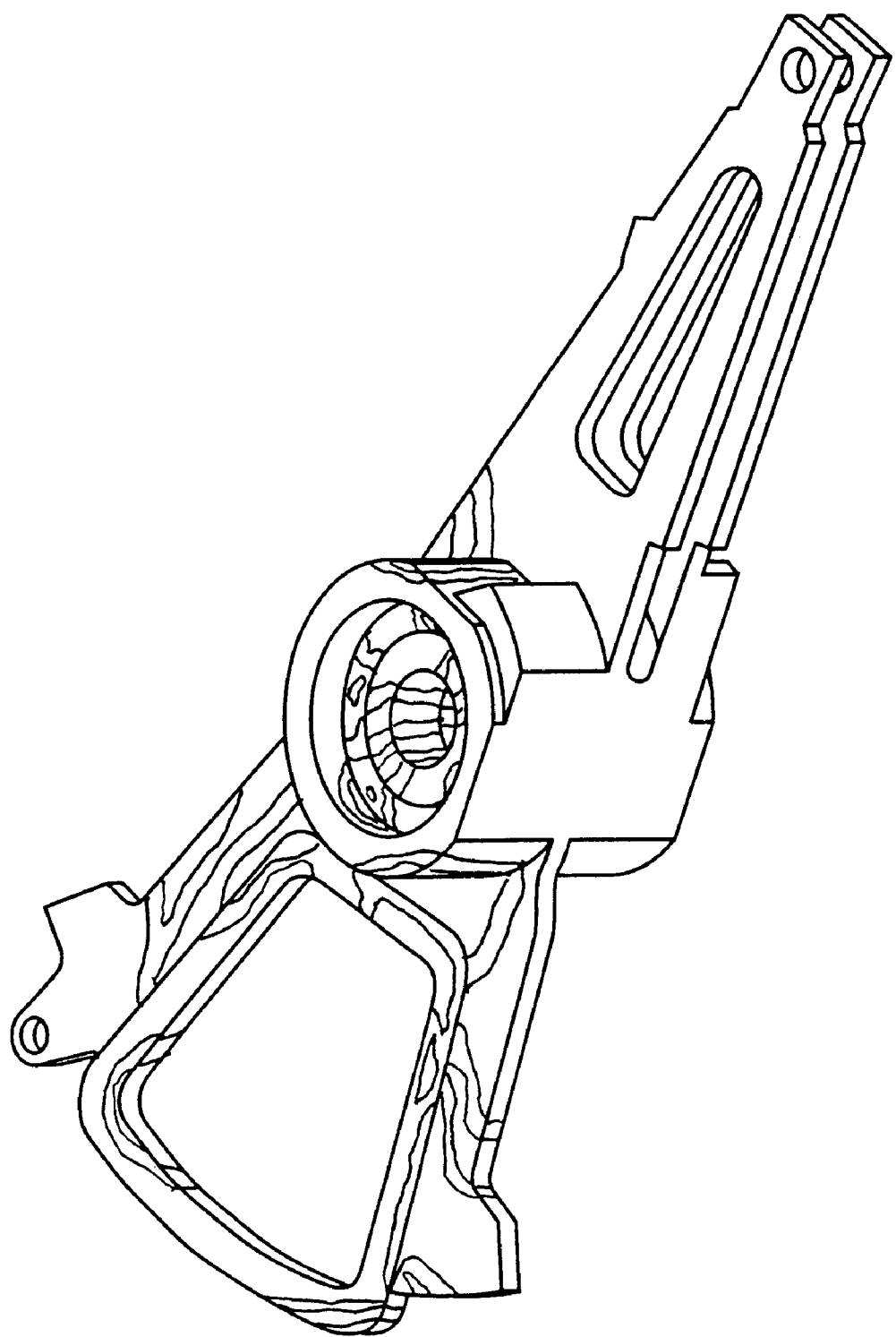
FIG. 10 is an illustrative drawing showing a head-arm unit and bearing parts with analysis results according to the embodiment of the present invention.
Figure 11:
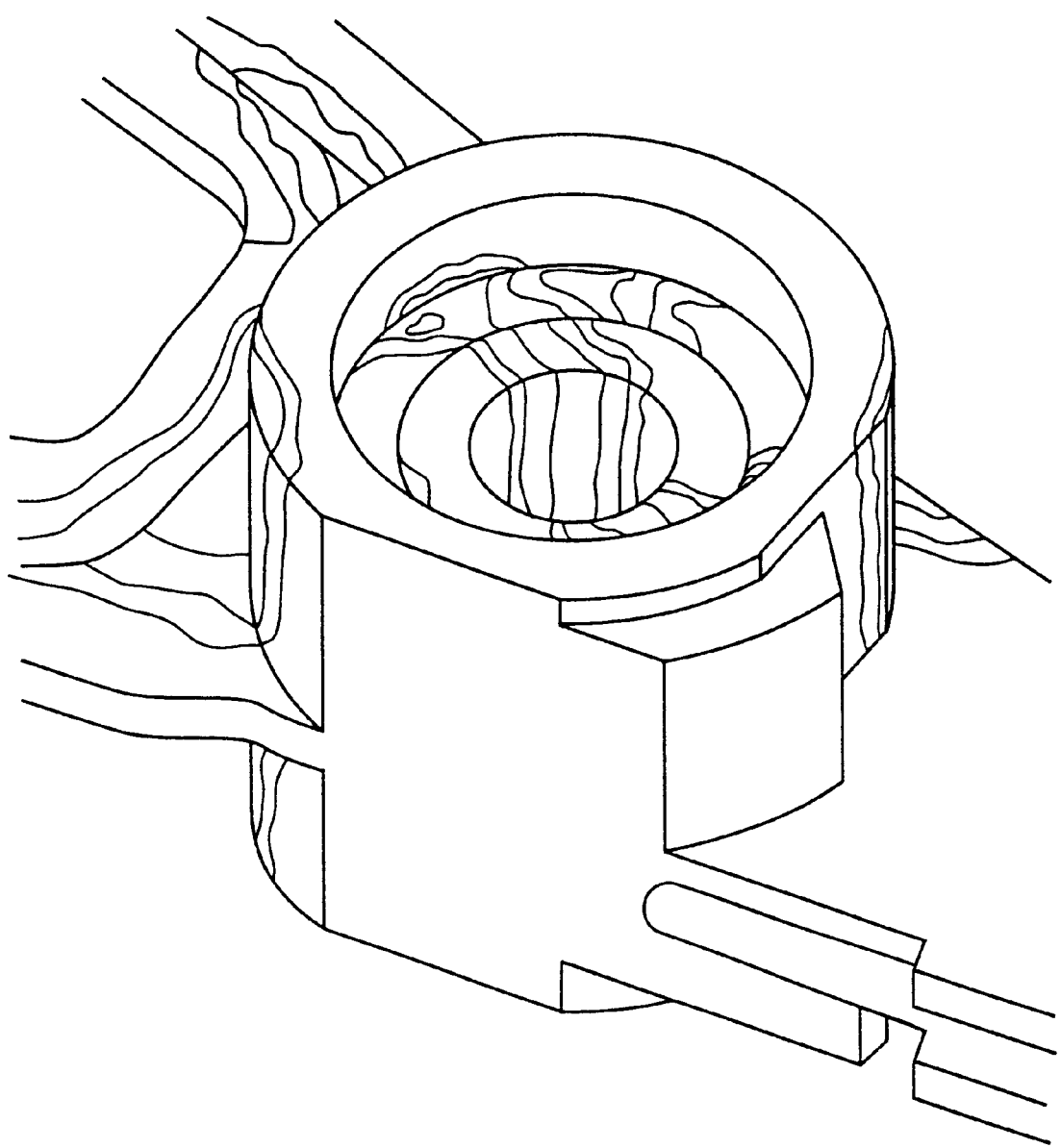
FIG. 11 is an illustrative drawing showing an enlarged view of a portion of the head-arm unit and the bearing parts with analysis results.

FIG. 10 is an illustrative drawing showing the head-arm unit and the bearing parts with analysis results according to the embodiment of the present invention. FIG. 11 is an illustrative drawing showing an enlarged view of a portion of the head-arm unit and the bearing parts with analysis results.

As shown in FIG. 10 and FIG. 11, the present invention properly obtains a distribution map of stresses that are experienced by the head-arm,unit and the bearing parts.

As described above, the present invention creates a model having an exterior shape of an analyzed object when the analyzed object is comprised of a plurality of components, and does not attempt to create a model having structural details exactly representing components of the analyzed object. Creation of a model is therefore carried out without much of difficulty.

Further, according to the present invention, an analyzed object is not replaced by simplified substitutes such as springs substituting for a bearing unit, but is modeled by using the exterior shape of the analyzed object. Because of this, it is possible to calculate shape shifts and stresses that are experienced by the analyzed object itself. This achieves an accurate analysis.

The above embodiment has been described with reference to an example in which a stress distribution is analyzed with respect to a bearing part. It should be noted, however, the present invention is not limited to this embodiment, but is universally applicable to analysis of an object that is comprised of a plurality of components.

Further, the present invention is not limited to these embodiments, but various variations and modifications may be made without departing from the scope of the present invention.

The present application is based on Japanese priority application No. 11-250797 filed on Sep. 3, 1999, with the Japanese Patent Office, the entire contents of which are hereby incorporated by reference.

What is claimed is:

1. A method of analyzing mechanical actions on an object comprised of a plurality of components, comprising:

creating a model having a general exterior shape of the object without regard to structural details of the components;

obtaining separate elasticity coefficients of the model in respectively different spatial directions; and analyzing mechanical actions on the object based on the model and the elasticity coefficients.

2. The method as claimed in claim 1, wherein said obtaining separate elasticity coefficients of the model obtains the separate elasticity coefficients of the model based on rigidities of the object in the respectively different spatial directions.

3. A device for analyzing mechanical actions on an object comprised of a plurality of components, comprising:

creating means for creating a model having a general exterior shape of the object without regard to structural details of the components;

obtaining means for obtaining separate elasticity coefficients of the model in respectively different spatial directions; and analyzing means for analyzing mechanical actions on the object based on the model and the elasticity coefficients.

4. The device as claimed in claim 3, wherein said obtaining means obtains the separate elasticity coefficients of the model based on rigidities of the object in the respectively different spatial directions.

5. A memory medium having a program embodied therein for causing a computer to analyze mechanical actions on an object comprised of a plurality of components, said program comprising:

creating code unit configured to create a model having a general exterior shape of the object without regard to structural details of the components;

obtaining code unit configured to obtain separate elasticity coefficients of the model in respectively different spatial directions; and analyzing code unit configured to analyze mechanical actions on the object based on the model and the elasticity coefficients.

6. The memory medium as claimed in claim 5, wherein said obtaining code unit obtains the separate elasticity coefficients of the model based on rigidities of the object in the respectively different spatial directions.

* * * * *